United States Patent [19]
Chan et al.

[11] Patent Number: 6,093,963
[45] Date of Patent: Jul. 25, 2000

[54] DUAL LANDING PAD STRUCTURE INCLUDING DIELECTRIC POCKET

[75] Inventors: Tsiu C. Chan, Carrollton; Frank R. Bryant, Denton; Loi N. Nguyen, Carrollton; Artur P. Balasinski, Dallas, all of Tex.

[73] Assignee: STMicroelectronics, Inc., Carrollton, Tex.

[21] Appl. No.: 08/943,382

[22] Filed: Oct. 2, 1997

Related U.S. Application Data

[60] Division of application No. 08/420,105, Apr. 11, 1995, Pat. No. 5,705,427, which is a continuation-in-part of application No. 08/361,760, Dec. 22, 1994, Pat. No. 5,702,979, and a continuation-in-part of application No. 08/361,939, Dec. 22, 1994, abandoned.

[51] Int. Cl.[7] .................................................. H01L 23/48
[52] U.S. Cl. .......................... 257/734; 257/758; 257/773
[58] Field of Search ................................... 257/734, 758, 257/761, 773, 401

[56] References Cited

U.S. PATENT DOCUMENTS

| | | | |
|---|---|---|---|
| 4,441,247 | 4/1984 | Gargini et al. | 29/571 |
| 4,707,457 | 11/1987 | Erb | 437/193 |
| 4,782,380 | 11/1988 | Shankar et al. | 357/71 |
| 4,789,885 | 12/1988 | Brighton et al. | 357/34 |
| 4,795,718 | 1/1989 | Beitman | 437/41 |
| 4,795,722 | 1/1989 | Welch et al. | 437/192 |
| 4,810,666 | 3/1989 | Taji | 437/30 |
| 4,822,749 | 4/1989 | Flanner et al. | 437/41 |
| 4,844,776 | 7/1989 | Lee et al. | 156/653 |
| 4,851,895 | 7/1989 | Green et al. | 357/67 |
| 4,868,138 | 9/1989 | Chan et al. | 437/44 |
| 4,884,123 | 11/1989 | Dixit et al. | 357/71 |

(List continued on next page.)

FOREIGN PATENT DOCUMENTS

| | | | |
|---|---|---|---|
| 0 369 336 A2 | 5/1990 | European Pat. Off. | H01L 21/90 |
| 0 380 327 A3 | 8/1990 | European Pat. Off. | H01L 23/522 |
| 0 499 433 A2 | 8/1992 | European Pat. Off. | H01L 21/90 |
| 0 503 904 A2 | 9/1992 | European Pat. Off. | H01L 21/90 |
| 0 566 253 A1 | 10/1993 | European Pat. Off. | H01L 23/485 |
| 62-136856 | 6/1987 | Japan | H01L 21/88 |
| 62-272555 | 11/1987 | Japan | H01L 21/88 |
| 89-304807 | 9/1989 | Japan | H01L 21/88 |
| 30-16220 | 1/1991 | Japan | H01L 21/3205 |
| 30-73531 | 3/1991 | Japan | H01L 21/3205 |
| 4-307732 | 10/1992 | Japan | H01L 21/28 |

OTHER PUBLICATIONS

E.K. Broadbent et al, "Selective Low Pressure Chemical Vapor Deposition of Tungsten," *J. Electrochem. Soc.: Solid–State. Science & Tech.*, vol. 131 No. 6 (Jun. 1984), pp. 1427–1433.

(List continued on next page.)

*Primary Examiner*—Carl Whitehead, Jr.
*Assistant Examiner*—Roy Potter
*Attorney, Agent, or Firm*—Theodore E. Galanthay; Lisa K. Jorgenson; Dan Venglarik

[57] ABSTRACT

A dual landing pad structure is formed with a dielectric pocket. A first opening is formed through a first dielectric layer to expose a portion of a diffused region. A first polysilicon landing pad is formed over the first dielectric layer and in the opening. This landing pad will provide for smaller geometries and meet stringent design rules such as that for contact space to gate. A dielectric pocket is formed over the polysilicon landing pad over the active region. A second conductive landing pad is formed over the polysilicon landing pad and the dielectric pocket. A second dielectric layer is formed over the landing pad having a second opening therethrough exposing a portion of the landing pad. A conductive contact, such as aluminum, is formed in the second contact opening. The conductive contact will electrically connect with the diffused region through the landing pad. Misalignment of the conductive contact opening over the landing pad may be tolerated without invading design rules. The landing pad and the dielectric pocket will enhance planarization to provide for better step coverage of the metal contact in the second opening.

20 Claims, 5 Drawing Sheets

U.S. PATENT DOCUMENTS

| | | | |
|---|---|---|---|
| 4,908,332 | 3/1990 | Wu | 437/194 |
| 4,916,397 | 4/1990 | Masuda et al. | 357/71 |
| 4,922,311 | 5/1990 | Lee et al. | 357/23.1 |
| 4,984,056 | 1/1991 | Fujimoto et al. | 357/67 |
| 4,994,410 | 2/1991 | Sun et al. | 437/192 |
| 4,997,790 | 3/1991 | Woo et al. | 437/195 |
| 5,036,378 | 7/1991 | Lu et al. | 357/23.5 |
| 5,036,383 | 7/1991 | Mori | 357/71 |
| 5,071,783 | 12/1991 | Taguchi et al. | 437/52 |
| 5,081,516 | 1/1992 | Haskell | 357/42 |
| 5,110,752 | 5/1992 | Lu | 437/47 |
| 5,158,910 | 10/1992 | Cooper et al. | 437/195 |
| 5,192,715 | 3/1993 | Sliwa, Jr. et al. | 437/195 |
| 5,198,683 | 3/1993 | Sivan | 257/67 |
| 5,210,429 | 5/1993 | Adan | 257/67 |
| 5,214,305 | 5/1993 | Huang et al. | 257/413 |
| 5,219,789 | 6/1993 | Adan | 437/192 |
| 5,229,326 | 7/1993 | Dennison et al. | 437/195 |
| 5,236,867 | 8/1993 | Furuta et al. | 437/189 |
| 5,247,199 | 9/1993 | Matlock | 257/371 |
| 5,275,963 | 1/1994 | Cederbaum et al. | 437/48 |
| 5,275,972 | 1/1994 | Ogawa et al. | 437/195 |
| 5,293,053 | 3/1994 | Malhi et al. | 257/330 |
| 5,296,729 | 3/1994 | Yamanaka et al. | 257/377 |
| 5,298,463 | 3/1994 | Sandhu et al. | 437/192 |
| 5,298,792 | 3/1994 | Manning | 257/758 |
| 5,308,795 | 5/1994 | Hawley et al. | 437/195 |
| 5,315,141 | 5/1994 | Kim | 257/308 |
| 5,316,976 | 5/1994 | Bourg, Jr. et al. | 437/195 |
| 5,334,862 | 8/1994 | Manning et al. | 257/67 |
| 5,359,226 | 10/1994 | DeJong | 257/773 |
| 5,414,302 | 5/1995 | Shin et al. | 257/752 |
| 5,420,058 | 5/1995 | Lee et al. | 437/41 |
| 5,448,091 | 9/1995 | Bryant et al. | 257/315 |
| 5,514,622 | 5/1996 | Bornstein et al. | 437/189 |
| 5,541,137 | 7/1996 | Manning et al. | 437/162 |
| 5,581,093 | 12/1996 | Sakamoto | 257/67 |
| 5,596,212 | 1/1997 | Kuriyama | 257/298 |
| 5,604,382 | 2/1997 | Koyama | 257/774 |
| 5,616,934 | 4/1997 | Dennison et al. | 257/67 |
| 5,633,196 | 5/1997 | Zamanian | 438/653 |

OTHER PUBLICATIONS

G. Queirolo et al, "Polycrystalline Silicon Films," *J. Electrochem. Soc.*, vol. 137 No. 3 (Mar. 1990) pp. 967–971.

C.S. Pai et al, "Chemical Vapor Deposition of Selective Epitaxial Silicon Layers," *J. Electrochem. Soc.*, vol. 137 No. 3 (Mar. 1990) pp. 971–976.

M. Cleeves et al, "A Novel Disposable Post Technology for Self–Aligned Sub–Micron Contacts," 1994 Symposium on VLSI Technology Digest of Technical Papers (1994). pp. 61–62.

DUAL LANDING PAD STRUCTURE INCLUDING DIELECTRIC POCKET

This application is a divisional application of U.S. patent application 08/420,105, filed on Apr. 11, 1995, now U.S. Pat. No. 5,705,427, and is a continuation-in-part application of U.S. patent application Ser. No. 08/361,760, filed Dec. 22, 1994, now U.S. Pat. No. 5,702,979 and U.S. patent application Ser. No. 08/361,939, filed Dec. 22, 1994 now abandoned, all of the applications assigned to SGS-Thomson Microelectronics, Inc. and incorporated herein by reference.

FIELD OF THE INVENTION

The present invention relates generally to semiconductor integrated circuit processing, and more specifically to an improved method of forming a landing pad structure under a metal contact.

BACKGROUND OF THE INVENTION

Design rules are required in integrated circuit design which allow for variations in the fabrication processes to protect against catastrophic failures and to guarantee the electrical parameters of the devices; the electrical parameters being related to the physical dimensions of the features. Certain feature sizes and minimum space or design tolerance must be maintained between devices in order to maintain the electrical integrity of the devices. Shapes and sizes may vary as a result of, for example, mask misalignment or variations in photoresist exposure. Design rules have thus been established for the various types of material used and the particular location of the devices on the chip, for example, width and spacing rules exist for metal, diffusion and polysilicon materials as well as for contact openings such as a metal contact space to gate. Any misalignment in the formation of a metal contact, for example to a diffused region, may invade the required space between the contact and a surrounding device such as the polysilicon gate. Thus, reduction in the minimum required spacing will not meet the design tolerance and will not insure the devices' electrical characteristics.

To avoid the problems caused by a metal contact when misalignment or other spacing problems occur between, for example, the metal contact and gate, a landing pad may be formed between the metal contact and an underlying diffused region. The landing pad may be formed from a polysilicon layer over which a silicide layer may be formed to decrease sheet resistance. Due to the design rules for polysilicon, the landing pad will allow for a reduction in the size of the cell and tolerate greater misalignment problems. The landing pad, however, creates a topography problem for subsequently formed layers. Depending on the actual layout, the contact opening formed over the landing pad may have a higher aspect ratio, the height of the contact opening divided by the width of the opening, than an opening formed without a landing pad. The larger the aspect ratio, the more difficult it will be to fill a contact opening.

An additional problem in the field of integrated circuit manufacture, particularly with the continuing trend toward smaller integrated circuit feature sizes, is the making of high-reliability conductive electrical contacts between metallization layers and semiconductor elements, particularly contacts between aluminum and diffused junctions in single-crystal silicon. This increased difficulty is due to the tendency for aluminum and silicon to interdiffuse when in contact with one another, and when subjected to the high temperatures necessary for integrated circuit manufacturing. As is well known in the art, conventional integrated circuit process steps can cause silicon from the substrate to diffuse rather rapidly into pure aluminum in an attempt to satisfy the solubility of silicon in aluminum. The silicon exiting the substrate is then replaced by the newly formed aluminum+silicon alloy. The diffusion back into the substrate of the aluminum+silicon alloy may diffuse to such a depth as to short out a shallow p-n junction in the silicon. This phenomenon is known as junction spiking. The use of silicon-doped aluminum in forming integrated circuit metallization, while preventing junction spiking, is known to introduce the vulnerability of the contact junction to the formation of silicon nodules thereat, such nodules effectively reducing the contact area, and thus significantly reducing the conductivity of the contact.

Accordingly, recent advances in the field of integrated circuit fabrication have been made by the introduction of so-called "barrier" layers at the aluminum-silicon interface. Conventionally, the barrier layer is a refractory metal material such as titanium-tungsten (TiW), or a refractory metal nitride such as titanium nitride (TiN). The barrier layer is formed at the contact location so as to be disposed between the silicon and the overlying aluminum layer. In some cases, the barrier layer is formed by deposition of the refractory metal, followed by an anneal which forms both the barrier layer and also a metal silicide where the metal is in contact with the silicon; as is known in the art, the metal silicide improves the conductivity of the contact. In any case, the barrier layer inhibits the interdiffusion of aluminum and silicon atoms, thus eliminating the problems of junction spiking and silicon nodule formation noted above.

While a barrier layer eliminates the problems associated with aluminum in direct contact with silicon, it is difficult to form a uniform barrier in contact openings that have a large aspect ratio such as that in contact with a landing pad. Even with today's deposition technology including chemical vapor deposition (CVD) and collimated sputtering, it is often hard to uniformly coat all sides in an opening, particularly in the corners of the openings. If the barrier layer is not thick enough, pin holes may result from inadequate coverage, resulting in the junction spiking problem noted above, to occur.

It is therefore an object of the present invention to provide a method of forming an integrated circuit with a landing pad in such a manner as to reduce the aspect ratio of the metal contact opening.

It is a further object of the present invention to provide such a method that provides more planarization for subsequent processing steps which will improve step coverage of subsequently formed barrier layers and metal contacts.

It is a further object of the present invention to provide such a method that tolerates misalignment of the contact opening to an active region in the substrate.

It is a yet further object of the present invention to provide such a method that tolerates misalignment of metal contact openings over the landing pad.

It is a further object of the present invention to provide such a method that utilizes standard processes.

Other objects and advantages of the present method will be apparent to those of ordinary skill in the art having reference to the following specification together with the drawings.

SUMMARY OF THE INVENTION

A dual landing pad structure is formed with a dielectric pocket. A first dielectric layer having a first opening therethrough is formed over the active region. A first polysilicon landing pad is formed over the first dielectric and in the first opening. A dielectric pocket may be formed over a portion of the polysilicon landing pad. If formed, the dielectric pocket enhances planarization of the conductive portion of the landing pad. A second dielectric layer is formed over the first landing pad with an opening therethrough to expose a portion of the landing pad. A second polysilicon landing pad is formed over the first landing pad to aid in the planarization at this stage of processing. A third dielectric layer is formed over a portion of the second landing pad having an opening therethrough to expose a portion of the second landing pad. A metal contact is then made to the second landing pad making electrical connection to the active region below. Misalignment of the first opening to the active region is tolerated without invading the design rules. Misalignment is further tolerated by the contact opening to the landing pad which has a width greater than the opening to the active region.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1–2A, 3–7A and 9 are cross-sectional views of the fabrication of a semiconductor integrated circuit according to one embodiment of the present invention.

FIGS. 2B, 7B–7C and 9 are cross-sectional views of the fabrication of a semiconductor integrated circuit according to an alternative embodiment of the present invention.

DETAILED DESCRIPTION OF THE PREFERRED EMBODIMENTS

Referring now to FIGS. 1–7, a method of fabricating an integrated circuit to have a landing pad according to the present invention will now be described in detail. The cross-sections of FIGS. 1–7 illustrate this method as a portion of an overall process flow for fabricating the integrated circuit. As will be apparent to those of ordinary skill in the art, the partial process flow to be described herein may be applied in the fabrication of many types of integrated circuits, in which the full process flow will include many other process steps conventional in the art.

Figure 1:
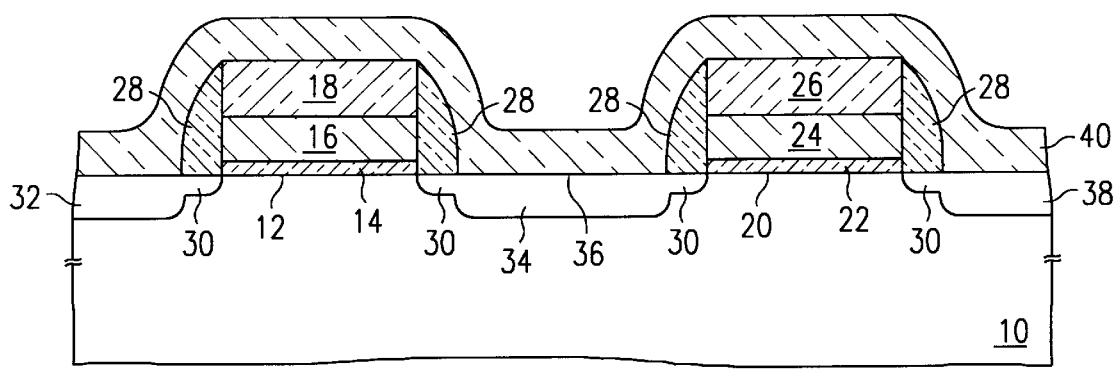

FIG. 1 illustrates, in cross-section, a portion of an integrated circuit that has been partially fabricated. According to the example described herein, the present invention is directed to forming a landing pad between a metallization layer such as aluminum and an active region such as a doped semiconductor region in single-crystal silicon, as such contacts are generally the most sensitive to the misalignment and design rules for spacing addressed by the landing pad and the spiking and nodule problems addressed by the barrier layer. It is contemplated, of course, that the present invention will also be applicable to the formation of other contacts, including, for example, contacts between metallization and polysilicon.

The structure of FIG. 1, includes silicon substrate 10. Various active devices may be formed on or in the surface of the substrate as well as overlying any field oxide regions which may be formed to separate devices. In a particular application, substrate transistors 12 and 20 are shown having gate oxide layers 14 and 22, and gate electrodes 16 and 24 overlying the gate oxide layers and typically formed from a layer of polysilicon. Alternatively, gate electrodes 16, 24 may be a polycide formed of a refractory metal silicide by chemical vapor deposition over a layer of polysilicon. As is known in the art, typically gate electrodes 16, 24 will have sidewall spacers 28, lightly doped drain regions 30 and source and drain or diffused regions 32, 34 shown for transistor 12 and diffused regions 34, 38 shown for transistor 20. Diffused or active region 34 may form a shared contact 36 between devices as is known in the art. In the preferred embodiment, diffused region 34 forms the source of one transistor and the drain of the adjacent transistor.

The diffused or active region 34 is formed of opposite conductivity type from that of substrate 10. For example, substrate 10 may be lightly doped p-type silicon and diffusion region 34 may be heavily doped n-type silicon. Of course, as noted above, other structures (with the same or opposite conductivity type selection) may alternatively be used; for example, substrate 10 may instead be a well or tub region in a CMOS process, into which diffusion or active region 34 is formed. In the example of FIG. 1, diffusion 34 is bounded by both substrate transistors 12, 20. In this example, diffusion 34 is very shallow, such as on the order of 0.15 microns, as is conventional for modern integrated circuits having sub-micron feature sizes. As such, diffusion 34 may be formed by ion implantation of the dopant followed by a high-temperature anneal to form the junction, as is well known in the art. Alternatively, the ion implantation may be performed prior to the formation of subsequent layers, with the drive-in anneal performed later in the process, if desired.

In the preferred embodiment, transistors 12, 20 may also have a capping layer 18, 26, respectively. The capping layer may be formed directly over the polysilicon gate electrodes 16, 24 or over a polycide. The capping layer is a dielectric or non-conductive material, preferably an oxide or nitride formed to encapsulate the gate electrode as more fully described in U.S. patent application Ser. No. 08/331691 (Attorney's Docket No. 94-C-86/88) filed on Oct. 31, 1994 and incorporated herein by reference. The capping layer is preferably formed to a depth of between approximately 500 to 2000 angstroms over the polysilicon before the polysilicon is patterned and etched to form the gate electrodes. The capping layer may then be patterned and etched with the polysilicon to cap only the polysilicon remaining which forms the gate electrodes. The sidewall spacers may then be formed after the capping layer is formed to further encapsulate the gate electrodes and increase the tolerance for design rules and provide sufficient distance between the gate electrodes and subsequently formed conductive regions adjacent to the transistor gates.

Dielectric layer 40, which may be a deposited oxide or another suitable dielectric layer, is formed over diffusion region 34 and other already formed devices such as transistors 12, 20. Dielectric layer 40, formed for purposes of electrically isolating overlying conductive structures from diffusion 34 and other devices except at locations where contacts are desired therebetween, may have a thickness of between approximately 500 to 2000 angstroms.

Figure 2A:
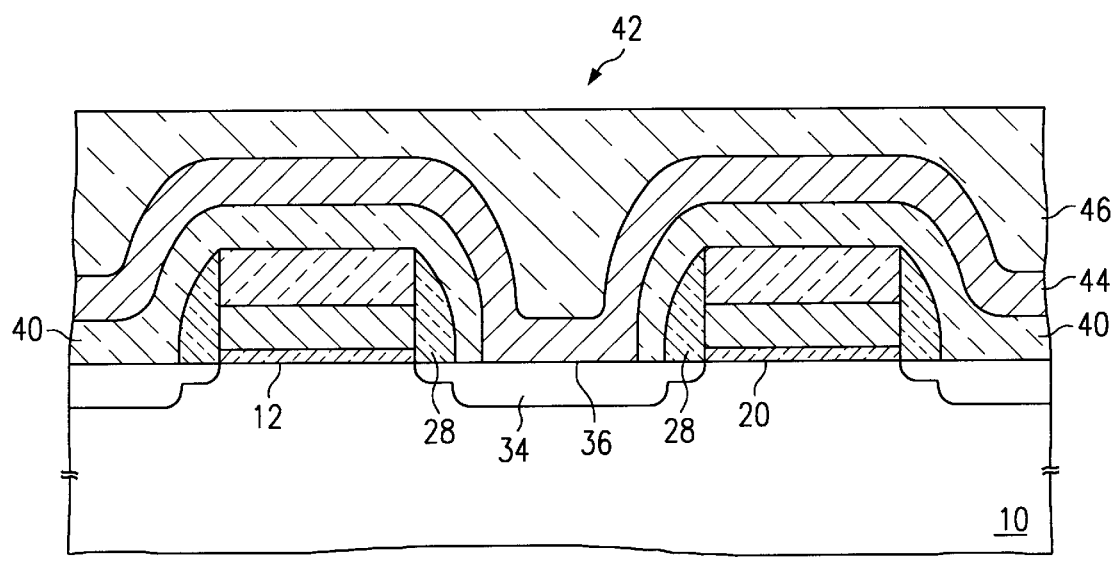
Figure 2B:
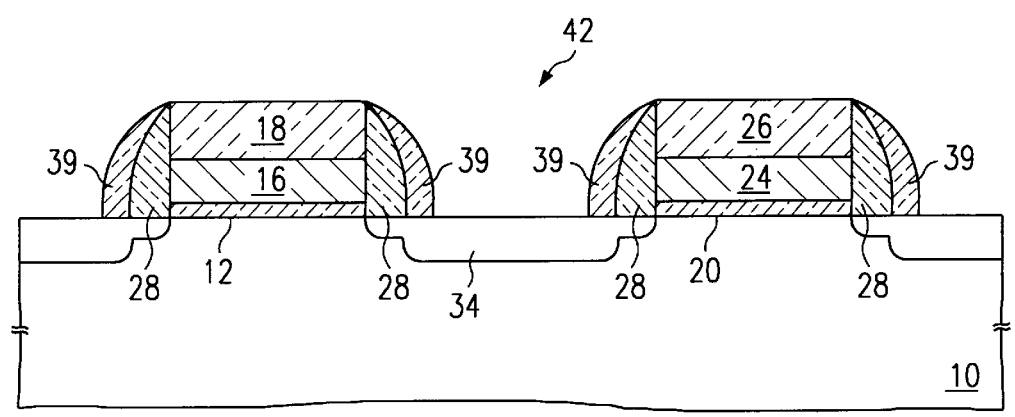

As shown in FIG. 2A, contact opening 42 is formed through dielectric layer 40, for example, by way of reactive ion etching or another type of anisotropic etching; as will be apparent below, this embodiment of the invention is concerned with the formation of an overlying landing pad that is in contact with diffusion region 34 and under an overlying metallization layer subsequently formed. Dielectric layer 40 is masked in order to etch primarily only opening 42 through layer 40. If dielectric layer 40 is etched without being masked, the upper surface of the layer is vertically etched essentially at the same rate as the opening. In this case, a second sidewall oxide spacer 39, as shown in FIG. 2B, is formed along the sides of sidewall spacers 28. These second sidewall spacers 39 will provide for a self-aligned contact to be made to the active or diffused region 34 and will increase the distance between the edge of the polysilicon gate 16, 24 and the edge of the contact opening 42. However, the distance from the top of the polysilicon gate 16, 24 to an overlying conductive layer will depend on the thickness of the capping layer 18, 26 since, in this example, the horizontal portion of the dielectric layer 40 overlying the capping layer was etched at essentially the same rate as the vertical portion of layer 40.

With reference to FIG. 2A, misalignment of the contact opening 42 over the diffused region 34, such as opening over the sidewall spacers, may decrease the contact space between the edge of gate electrodes 12, 20 and the side of the contact opening 42. Due to any misalignment of the contact opening, effectively opening over the sidewall spacers 28 or 39 (as shown in FIG. 2B) of either transistor 12, 20, the distance between these active areas may be reduced enough such that the design rules for a metal contact space to gate are not met and device yield may thus decrease. In addition, misalignment of the contact opening 42 increases the aspect ratio of the opening, increasing step coverage problems for metal contacts. To prevent any misalignment of the opening 42 from removing the sidewall spacers during the etch of dielectric layer 40, these sidewall spacers 28 may be formed of nitride. In the preferred embodiment, a material is formed in contact opening 42 whereby the design rules for contact space or side of contact 42 to edge of gates 12, 20 are met while enhancing the planarization of the surface topography to allow barrier layers and metal contacts to be uniformly formed.

With reference to FIGS. 2A–4, the present invention will be further described following from FIG. 2A. It will be appreciated, however, from those skilled in the art that this invention may be practiced with the second sidewall spacer as shown in FIG. 2B. Referring now to FIG. 2A, a polysilicon layer 44 is formed over dielectric layer 40 and in the contact opening 42 in contact with the diffused region 34. Polysilicon layer 44 is preferably about 500 to 2000 angstroms thick and is preferably deposited as an in situ doped polysilicon being doped with a similar dopant as the diffused region 34, such as by ion implantation or other suitable method. In this example, if the diffused region 34 is $N^+$, the polysilicon layer 44 may be $N^+$ insitu doped polysilicon as deposited with sufficient doping level to reduce the contact resistance of this layer and provide an adequate electrical path to the diffused region 34. In this example, the doping level is approximately $10^{20}$ ions/cm$^3$ as formed. In order to provide a relatively thin polysilicon layer 44 which will enhance planarization, yet provide an adequate electrical connection to the active region 34, the conformal polysilicon does not fill contact opening 42. A dielectric layer 46 is formed over the polysilicon layer 44, preferably a spin-on-glass or other suitable planarizing material.

Figure 3:
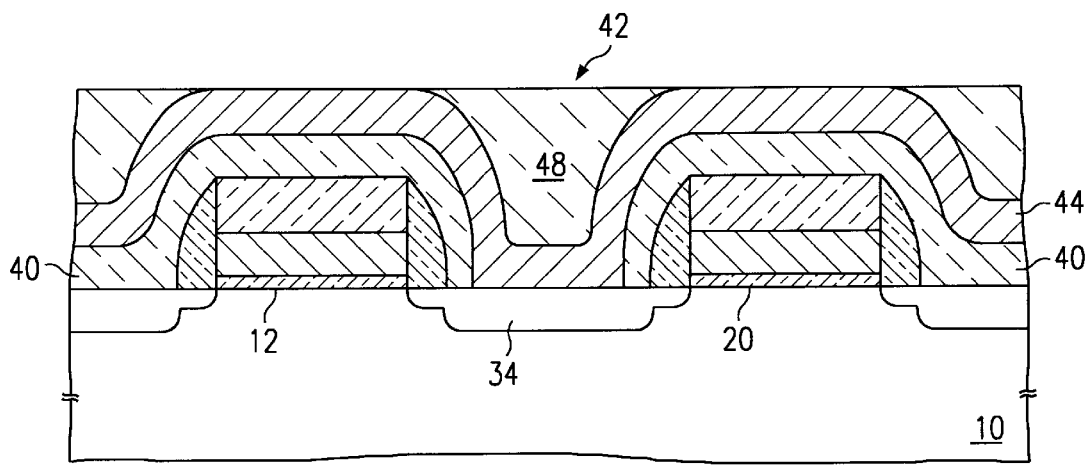
Figure 4:
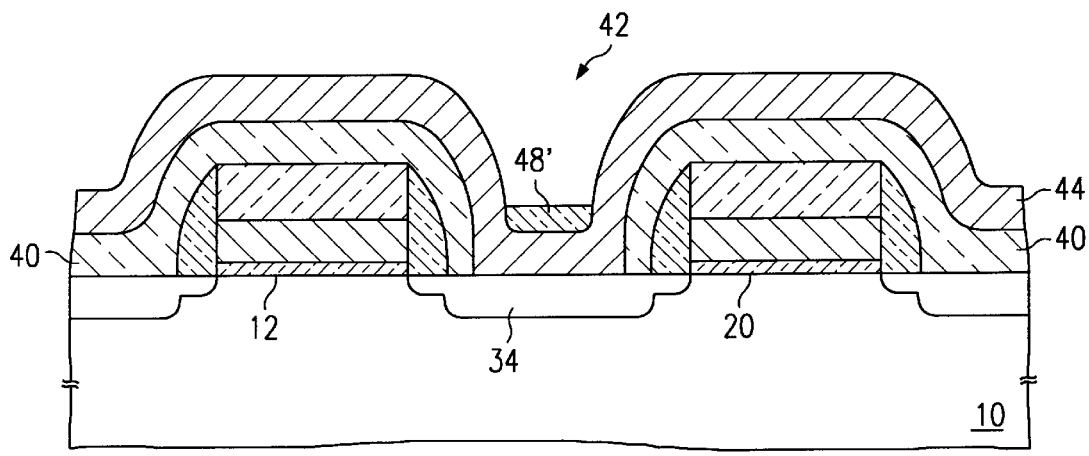

Referring to FIG. 3, the dielectric layer is etched back to expose the upper portion of the polysilicon layer not in the opening 42. The etch back will form pockets of dielectric material 48 in areas lower than the upper surface of the polysilicon. The dielectric layer will increase the planarization of the wafer at this stage of manufacturing and is easy to form in the pockets. Depending upon the height of various devices which are covered by polysilicon layer 44 and the distance between these devices as well as the amount of SOG material spun onto the wafer, the etchback of the SOG may leave various sizes of pockets of SOG 48' as illustrated in FIG. 4.

Figure 5:
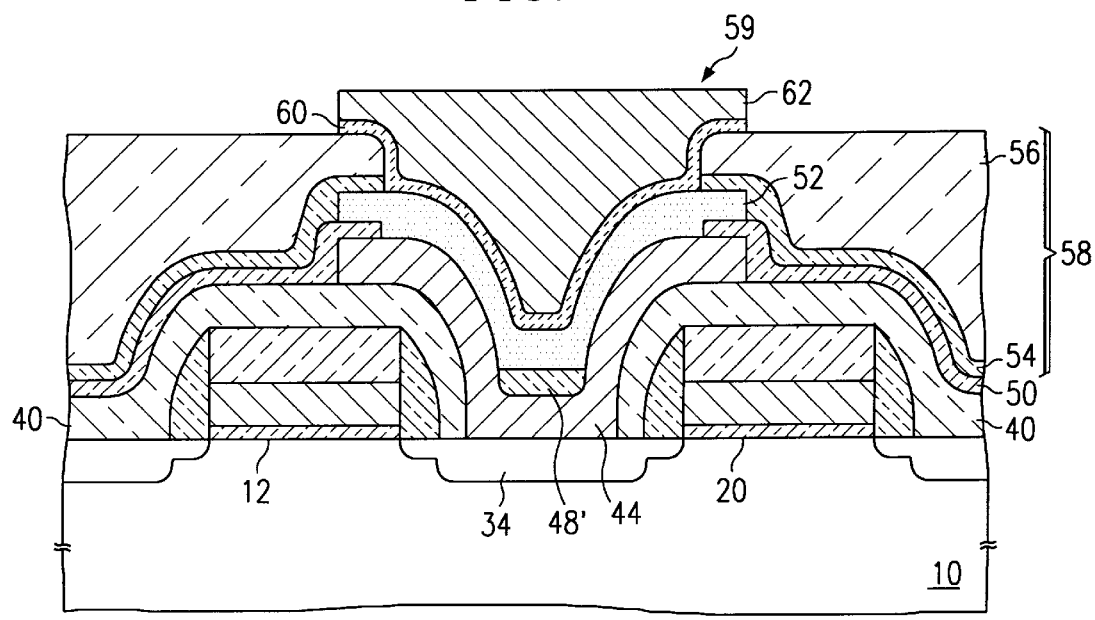

Referring to FIG. 5, a second dielectric layer 50 is formed over the polysilicon landing pad 44, preferably by deposition of an undoped oxide to a thickness of between approximately 1000 to 2000 angstroms. Alternatively, the dielectric may be a composition of various dielectric materials. By way of example, layer 50 may be a SOG sealed by a deposited thin oxide which itself may be covered by a second SOG which is again sealed by a deposited thin oxide. The SOG under the oxide will tend to enhance planarization while the oxide protects the SOG during subsequent high temperature processing steps. An opening is formed in the dielectric layer 50 exposing a portion of landing pad 44. Dielectric layer 50 will enhance planarization of the wafer at this stage of the processing while allowing a contact to be made to the first polysilicon landing pad 44. As will be appreciated by those skilled in the art, other openings through the dielectric 50 may also be formed at this time to other areas on the wafer.

A second polysilicon layer 52 is formed over the exposed portion of the first landing pad 44 and the dielectric layer 50. Polysilicon layer 52 is preferably deposited as an insitu doped polysilicon being doped with a similar dopant as polysilicon landing pad 44. As an alternative, polysilicon layer 52 may be undoped when formed. A photoresist layer (not shown) may be formed over the undoped polysilicon layer 52 which is not over the landing pad 44. The polysilicon layer 52 may then be doped with appropriate dopants, preferably by ion implantation or other suitable method to lower the contact resistance of the polysilicon 52 and form an adequate conductive path to the diffused region 34 through landing pad 44.

The second polysilicon layer 52 is patterned and etched to form a second landing pad over the first landing pad 44. Prior to the formation of the dielectric layer 50 and the second polysilicon landing pad 52, the aspect ratio of the contact over the polysilicon landing pad 44 is still fairly high, whereby step coverage of metal contacts is still not maximized. The addition of a second landing pad 52 as well as the dielectric 50 between the first and second landing pads will enhance planarization and decrease the aspect ratio of the contact opening. Additionally, the dual landing pad with an interpolysilicon dielectric is formed without additional masking layers. The dual landing pad 44, 52 will provide for proper design rules for spacing such as that between the contact edge in opening 42 and transistor gate edges of gates 12, 20 caused by such factors as smaller required geometries and misalignment of the contact openings over the active region 34.

A third dielectric layer 58 is formed over the landing pad 52 and second dielectric layer 50. The third dielectric layer 58 may be, for example, a multi-layer film or a glass layer such as spin-on-glass or borophosphorous silicate glass (BPSG) again to aid in planarization of the surface of the wafer at this stage of processing. An example of a multi-layer film may be an undoped oxide 54 formed under a BPSG layer 56. The undoped oxide may aid in protecting areas of the chip during subsequent processing steps and in particular will help to prevent the BPSG layer from forming directly on active areas which may not be covered by the first dielectric layer 40. The dielectric layer 58 will have a thickness dependent upon the underlying topography and may be between approximately 3000 to 12000 angstroms. An opening 59 is formed through the dielectric layer 58 exposing a portion of the landing pad 52. If BPSG is used for the second dielectric layer 58, as is known in the art, it can be reflowed to round the corners at the opening 59.

A conductive layer is formed over the dielectric layer 58 and in opening 59, patterned and etched to form a conductive contact 62. Contact 62 is typically an aluminum alloy or a composite barrier layer 60 underlying an aluminum alloy, as is known in the art. A barrier layer formed under the metal contact may be necessary to reduce the well known wear out failure mechanisms referred to as stress induced migration and electromigration. A thin barrier layer 60 of a refractory metal or refractory metal nitride may be deposited in the opening 59 and over the dielectric layer 58 by way of sputtering or other suitable method, to a thickness of about 400 to 1000 angstroms. As is known in the art, barrier layer 60 is preferably formed of titanium nitride or other suitable refractory metal nitride, or may be formed of titanium, titanium-tungsten, or other suitable refractory metal. The barrier layer may alternatively be formed of a refractory metal nitride over a refractory metal, for example, a titanium nitride may be formed over a titanium layer. The material and thickness of barrier layer 60 are selected to optimize process conditions to prevent diffusion of atoms between an overlying conductive layer and the underlying landing pad 52.

Figure 6:
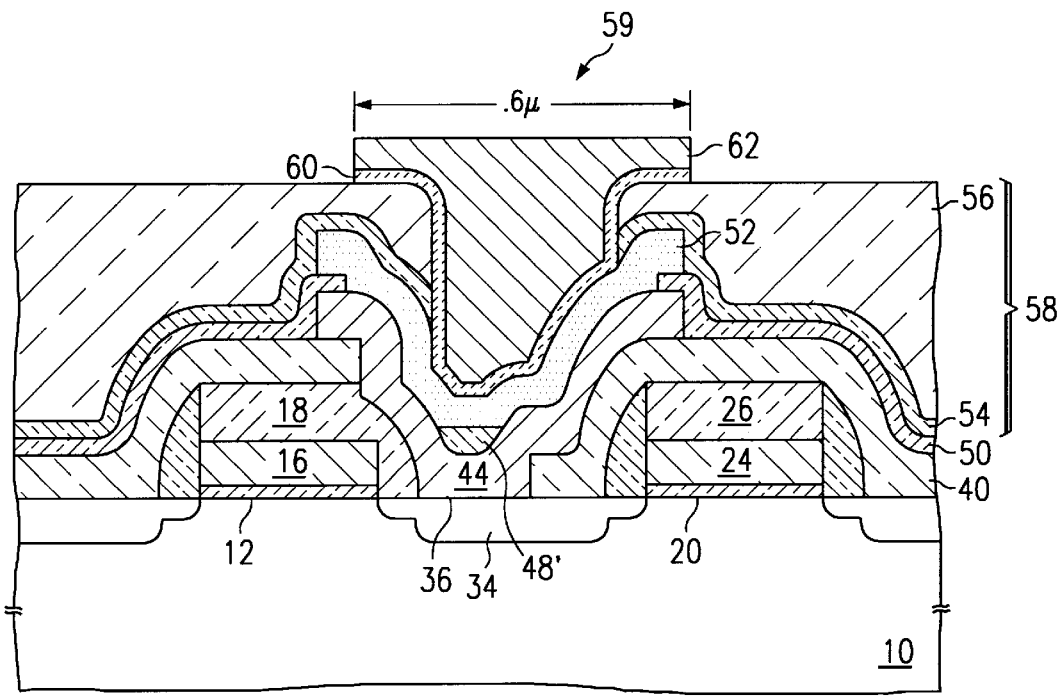

Referring to FIG. 6, the contact 62 makes electrical connection to diffused region 34 through the dual landing pads 44 and 52. Misalignment of the width and location of the lower contact opening, as shown in this example, through dielectric layer 40, effectively opening over the polysilicon gate electrode 16 through the capping layer 18 reduces the distance between the edge of the contact opening to the edge of transistor 12. More severe misalignment problems may occur creating additional spacing concerns. In addition, increases in the misalignment will increase the aspect ratio of the opening, causing additional step coverage problems. However, with the polysilicon 44 formed in the opening instead of a metal, the design rules for a metal contact space to gate are not violated while at the same time the polysilicon's conformal deposition will fill the bottom of the contact opening.

In contrast to misalignment of the lower contact opening through layer 40, any misalignment of the width and location of the upper contact opening 59 over the landing pad 52, as shown in FIG. 6 is not as critical. With the landing pads 44, 52 formed between the contact 62 and the active region 34, the design rules for contact to gate spacing are maintained. A wider and/or more shallow contact opening 59 over the landing pads 44, 52 may thus be formed to facilitate the deposition of a contact metal such as aluminum or other suitable contact metal with a barrier layer under the contact metal. The barrier layer will be able to form more uniformly along the sides and bottom of the contact opening and more particularly in the corners. In addition, some misalignment of contact opening 59 over the landing pad 52 will be tolerated without invalidating design rules, such misalignment of the contact opening 59 for a metal contact not being tolerated at the diffused region 34, in this example between transistors 12, 20.

A dual polysilicon landing pad with an interpolysilicon dielectric, has the advantage of enhancing planarization and improving the barrier and metal contact step coverage by reducing the aspect ratio for the upper metal contact. Planarization is further enhanced with the dielectric between the polysilicon landing pads 44 and 52. Additionally, nitride spacers may be used for the substrate transistors to self-align the contact opening for the polysilicon to active area contact and to thereby decrease the overall cell area without invading required design rules.

Figure 7A:
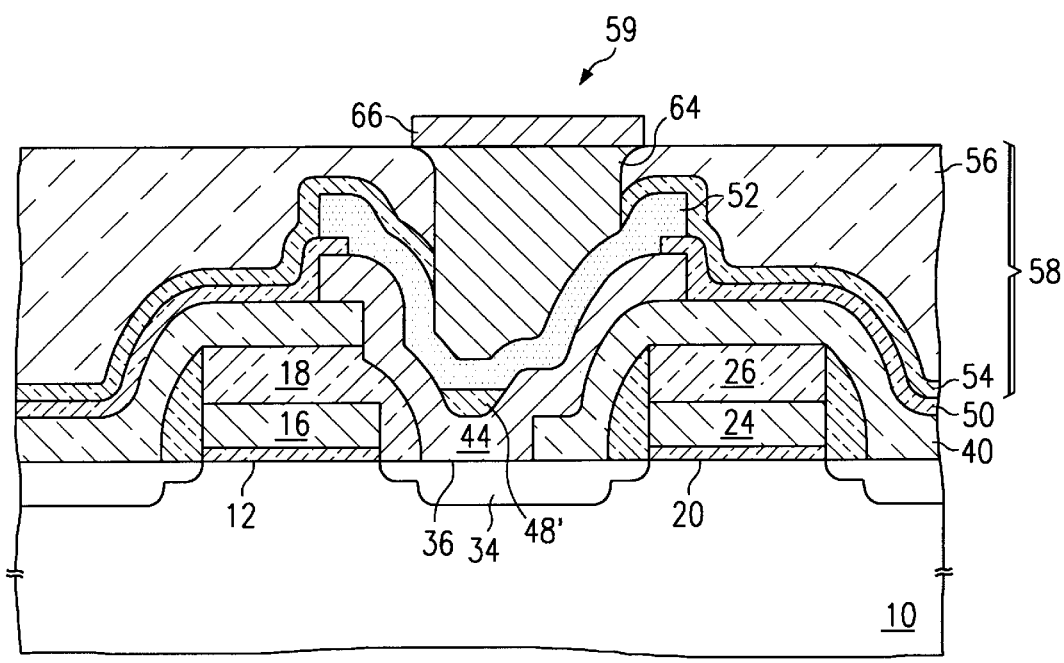
Figure 7B:
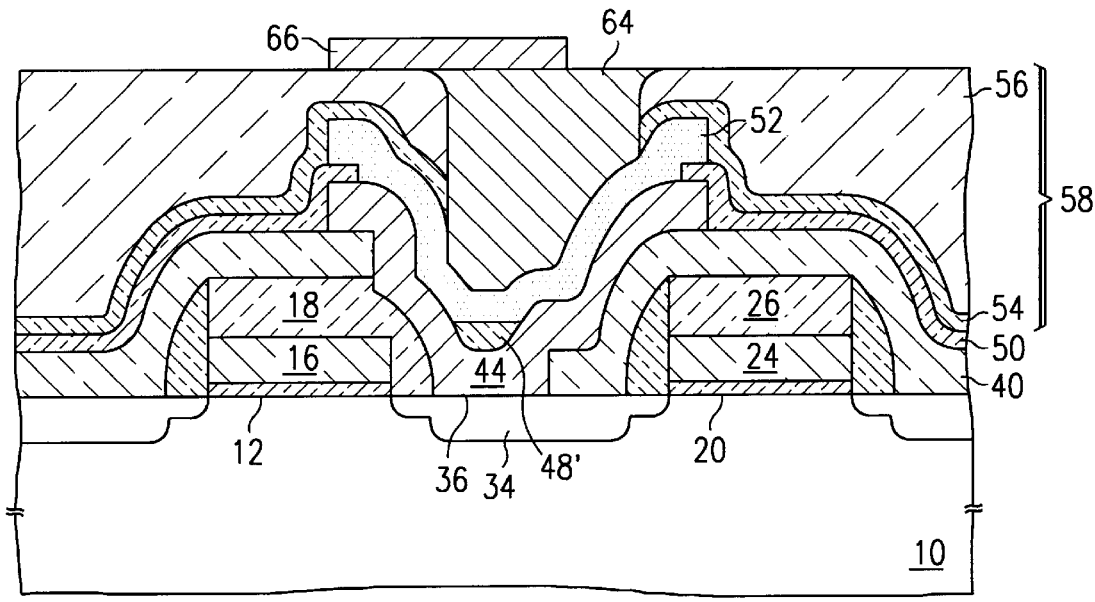
Figure 7C:
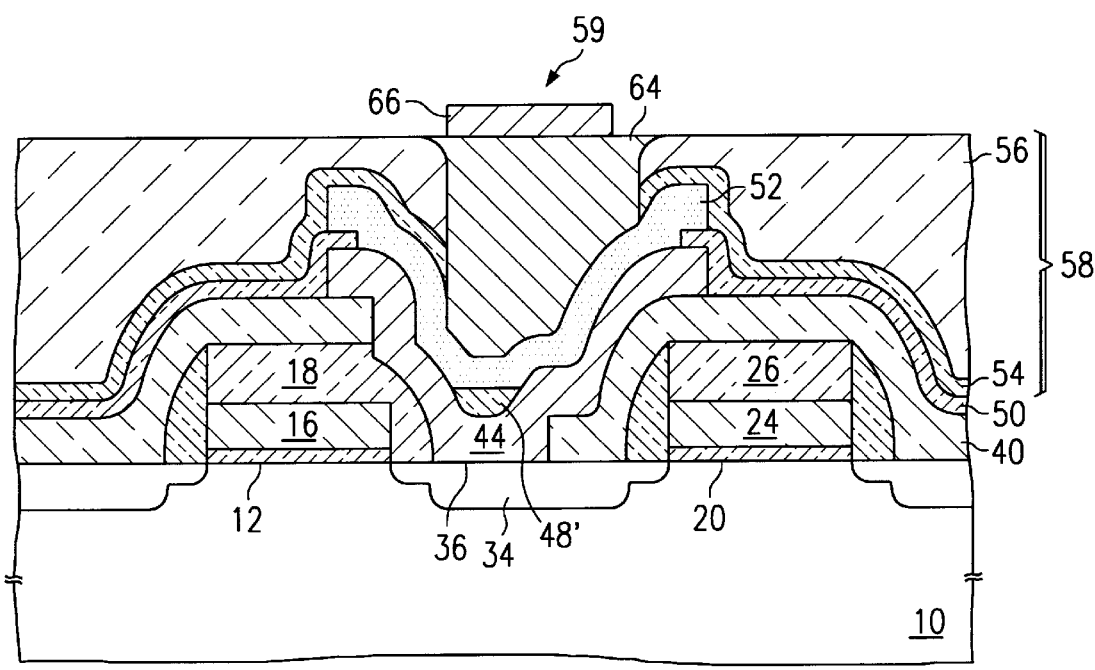

A Referring to FIGS. 7A–7C, an alternative conductive contact may be formed, particularly if there is a high aspect ratio of the contact opening 59 over the polysilicon landing pad 52. Referring to FIG. 7A, a plug 64, preferably tungsten, may be formed by way of chemical vapor deposition and etched back to expose the upper surface of dielectric layer 58, as more fully described in U.S. Pat. No. 4,592,802 filed on Apr. 10, 1985 and incorporated herein by reference. After the etch back, a conductive layer, for example, an aluminum alloy may be formed, pattered and etched as known in the art to form a conductive contact 66 between the conductive plug 64 and an overlying conductive region subsequently formed. By forming a tungsten plug, a thinner and smaller aluminum contact 66 may be formed overlying the plug 64 and dielectric layer 58. Misalignment of the contact 66, as shown in FIG. 7B, or undersizing of the contact, as shown in FIG. 7C can occur while still maintaining the device integrity. If an offset occurs or if the conductive contact 66 width is smaller than the width of the opening 59, the tungsten will act as an etch stop when the contact 66 is patterned and etched.

Figure 8:
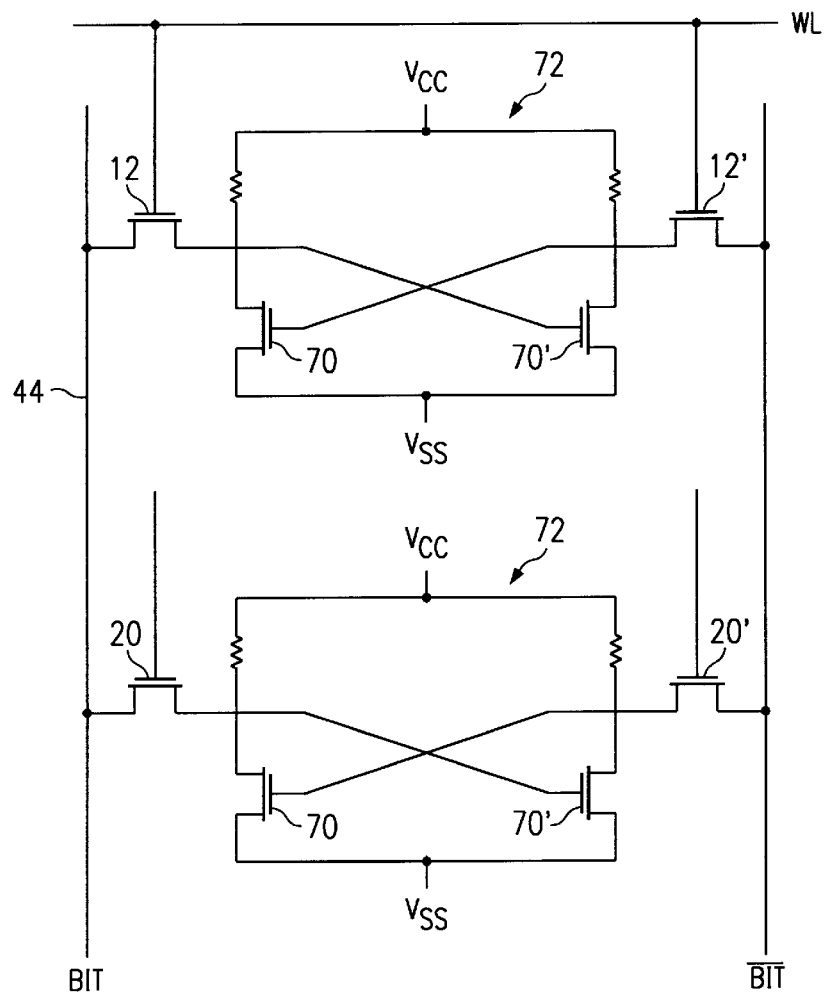
FIG. 8 is a schematic representation of a semiconductor integrated circuit according to one embodiment of the present invention.
Figure 9:
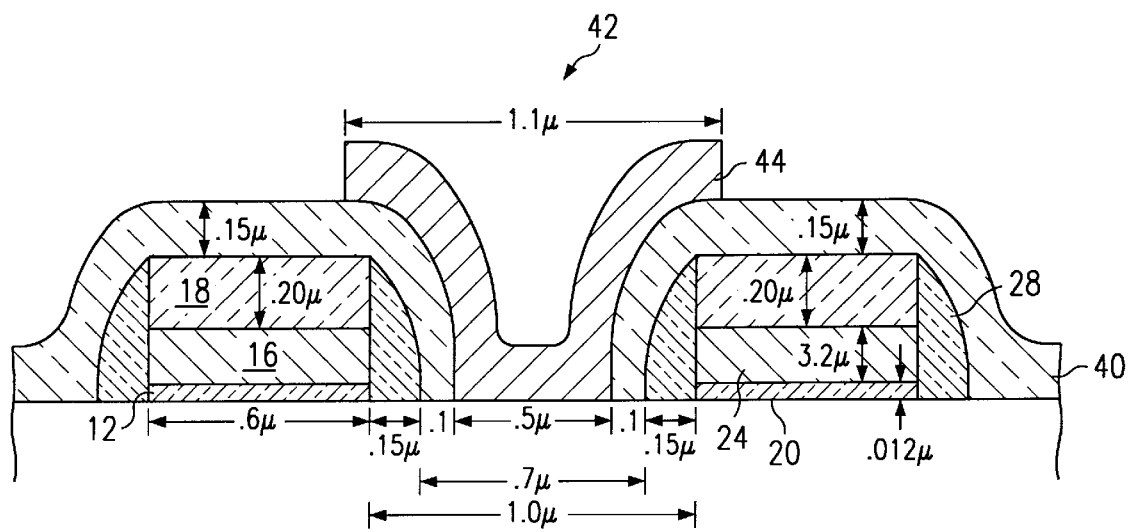

Referring now to FIGS. 8–9, the present invention will be described showing its desirability to submicron geometries. It has been discovered that this process is well-suited for very small geometries evolving in future technology. The need to shrink feature sizes has led to smaller device dimensions. One of the most important dimensions to be decreased in each new generation is the minimum gate length of the transistors. Referring to FIG. 8, a typical gate length, for example, for 0.5 micron technology is 0.5 microns for the n-channel pull-down transistors 70 and 70' while the pass-gate or transfer gate transistors 12, 20 as illustrated in FIGS. 1 and 8, may need to be larger than 0.5 microns to maintain the stability of the memory cell 72. As the pass-gates 12, 20 and their cell complements 12' and 20' are turned on and off from the word line (WL) to read from or write to the memory cell 72, as known in the art, the n-channel transistors must not flip to an undesired state. To accomplish this, the n-channel gate length is made smaller, such as 0.5 microns while the transfer gate length is made larger, e.g., 0.6 microns. The appropriate gate lengths will enable the n-channel transistors to maintain a lower impedance and larger gain than the pass-gate transistors while allowing the n-channel transistors to remain stable during the time that the pass-gate transistors are turned on and off.

Referring to FIG. 9, it can be seen that the gate length for the pass-gate transistors 12, 20 is shown here as 0.6 microns. This length can be further decreased as the overall geometries are decreased as long as the design rules are maintained. One critical design rule of concern is the metal contact to gate spacing. For example, there must be sufficient distance between the edge of the polysilicon gate electrode 16 and the edge of the contact opening 42. In this example, the sidewall spacer 28 is 0.15 microns wide and the oxide layer 40 is 0.10 microns wide near the bottom of opening 42 and 0.15 microns thick on top of the capping layer 18. The sidewall spacer 28 would be smaller if the capping layer 18 had not been formed, which in this case is shown as having a thickness of 0.2 microns. The capping layer 18 will help to increase the distance between the gate electrode 16 and a contact formed in opening 42, particularly if the opening 42 is misaligned and opens through oxide layer 40 over the gate electrode 16 or the sidewall spacer 28 as shown in FIG. 7.

In this example, the minimum space between transistors 12 and 20 is 1.0 micron. The contact opening is thus 0.5 microns after subtracting the width of the sidewall spacers 28 and oxide regions 40. The polysilicon layer is then ready to be conformally deposited and patterned to form landing pad 44. The required distance between polysilicon gate 16 or 24 and polysilicon landing pad 44 is maintained to insure that no short circuits are formed. The landing pad 44 is patterned, in this case, to be 1.0 microns ±0.05 microns, or a maximum width of 1.1 microns. In the preferred embodiment, the second polysilicon landing pad 52, shown in FIG. 7, will be patterned to have the same dimensions as the first polysilicon landing pad 44.

Referring to FIG. 6, the width of the conductive contact 62 is shown as 0.6 microns. This dimension is determined both by the underlying topography and critical dimensions as well as the overlying regions to be formed with their associated dimensions. However, as can be seen from FIG. 7A, if an aluminum layer 66 is formed over a tungsten plug, then a zero-enclosure can be achieved whereby the width of the aluminum is the same or less (see FIG. 7C) than the width of opening 59.

Other desired maximum dimensions for smaller geometries are also shown in FIG. 9, illustrating the applicability of this invention to the evolving technology. While the invention has been described herein relative to its preferred embodiments, it is of course contemplated that modifications of, and alternatives to, these embodiments, such as modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. The structure of a portion of a semiconductor integrated circuit formed at a surface of a body, comprising:

a plurality of devices over a substrate;

an active region on the substrate between at least two devices;

a first dielectric layer disposed over at least a portion of the devices and a portion of the active region and having an opening therethrough exposing a portion of the active region;

a first polysilicon landing pad disposed in the opening over the exposed portion of the active region and a portion of the first dielectric layer;

a dielectric pocket disposed in the opening over a lowest, central portion of the polysilicon landing pad, wherein an upper surface of the first polysilicon landing pad in a peripheral region of the polysilicon landing pad outside the opening is exposed and is higher above the substrate than an upper surface of the dielectric pocket; and a second polysilicon landing pad disposed over the exposed portion of the first polysilicon landing pad and over the dielectric pocket in the opening.

2. The structure of claim 1, further comprising:

a second dielectric layer disposed between the first and second landing pads.

3. The structure of claim 1, further comprising:

a third dielectric layer disposed over a portion of the second landing pad.

4. The structure of claim 3, further comprising:

a conductive contact disposed over the exposed portion of the second landing pad.

5. A portion of a semiconductor integrated circuit device structure, comprising:

a first dielectric layer overlying a device region including an active area;

a first opening through the first dielectric layer substantially over the active area;

a first polysilicon landing pad in the first opening and over a portion of the first dielectric layer;

a dielectric plug in the first opening over a portion of the first landing pad;

a second dielectric layer over a portion of the first landing pad, the second dielectric layer having a second opening therethrough exposing a portion of the first landing pad and the dielectric plug;

a second polysilicon landing pad in the second opening over the exposed portion of the first landing pad and the dielectric plug and over a portion of the second dielectric layer; and a third dielectric layer over the second dielectric layer and a portion of the second landing pad, the third dielectric layer having a third opening therethrough exposing a portion of the second landing pad.

6. The structure of claim 5, wherein the active area has a length of approximately 1.0 micron.

7. The structure of claim 5, wherein the first opening has a width of approximately 0.5 microns.

8. The structure of claim 5, wherein the first polysilicon landing pad has a thickness of between approximately 500 to 2000 angstroms.

9. The structure of claim 5, wherein the second polysilicon landing pad has a thickness of between approximately 500 to 2000 angstroms.

10. The structure of claim 5, wherein the first dielectric layer has a thickness of approximately 0.15 microns in regions overlying a horizontal surface and approximately 0.10 microns in regions overlying a vertical surface.

11. The structure of claim 5, wherein the second dielectric layer has a thickness of between approximately 3000 to 12000 angstroms.

12. The structure of claim 5, wherein the third dielectric layer has a thickness of between approximately 3000 to 12000 angstroms.

13. The structure of claim 5, further comprising:

a conductive plug in the third opening and contacting the second landing pad.

14. A portion of an integrated circuit device structure, comprising:

first and second gate structures spaced apart over a surface of a substrate;

sidewall spacers adjacent the first and second gates structures;

a first dielectric layer over the first and second gate structures and the sidewall spacers;

a first opening through the first dielectric layer exposing a portion of the substrate between the first and second gate structures;

a first polysilicon landing pad over a portion of the first dielectric layer and in the first opening, the first landing pad contacting the exposed portion of the substrate;

a dielectric plug in the first opening over a portion of the first landing pad;

a second dielectric layer over a portion of the first landing pad, the second dielectric layer having a second opening therethrough exposing a portion of the first landing pad and the dielectric plug;

a second polysilicon landing pad in the second opening over the exposed portion of the first landing pad and the dielectric plug and over a portion of the second dielectric layer; and a third dielectric layer over the second dielectric layer and a portion of the second landing pad, the third dielectric layer having a third opening therethrough exposing a portion of the second landing pad.

15. The structure of claim 14, wherein the first and second gate structures are separated by a distance of approximately 1 micron.

16. The structure of claim 14, wherein the exposed portion of the substrate has a width of approximately 0.5 microns.

17. The structure of claim 14, wherein the first and second gate structures have a height of approximately 3.412 microns over the surface of the substrate.

18. The structure of claim 14, wherein the first dielectric layer has a thickness of approximately 0.15 microns over the first and second gate structures and approximately 0.10 microns in the first opening.

19. The structure of claim 14, wherein the first landing pad has a width of approximately 1.1 microns at an upper portion and 0.5 microns at a lower portion.

20. The structure of claim 14, wherein the first gate structure is a gate for a pull-down transistor and the second gate structure is a gate for a pass-gate transistor.

* * * * *